(12) United States Patent
Chung

(10) Patent No.: US 8,054,663 B2
(45) Date of Patent: Nov. 8, 2011

(54) PROCESS VARIATION COMPENSATED MULTI-CHIP MEMORY PACKAGE

(75) Inventor: Hoe-ju Chung, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 198 days.

(21) Appl. No.: 12/264,356

(22) Filed: Nov. 4, 2008

(65) Prior Publication Data

US 2009/0237970 A1    Sep. 24, 2009

(30) Foreign Application Priority Data

Mar. 19, 2008  (KR) .................. 10-2008-0025377

(51) Int. Cl.
*G11C 5/02* (2006.01)
*G11C 7/00* (2006.01)
*G11C 8/00* (2006.01)

(52) U.S. Cl. ........... 365/51; 365/52; 365/63; 365/194; 365/226; 365/230.03; 365/233.1; 365/233.13

(58) Field of Classification Search .............. 365/51, 365/52, 63, 194, 233.1, 233.13, 230.03; 327/158
See application file for complete search history.

(56) References Cited

U.S. PATENT DOCUMENTS

| | | | | |
|---|---|---|---|---|
| 6,049,476 A * | 4/2000 | Laudon et al. | ............... | 365/52 |
| 6,078,514 A * | 6/2000 | Takemae et al. | ............... | 365/63 |
| 6,272,069 B2 * | 8/2001 | Tomita et al. | ............... | 365/233.1 |
| 6,330,627 B1 * | 12/2001 | Toda | ............... | 365/194 |
| 6,654,270 B2 * | 11/2003 | Osaka et al. | ............... | 365/51 |
| 7,071,745 B2 * | 7/2006 | Heightley et al. | ............... | 327/158 |
| 7,095,661 B2 * | 8/2006 | Osaka et al. | ............... | 365/194 |
| 7,154,809 B2 * | 12/2006 | Gregorius et al. | ............... | 365/194 |
| 7,212,423 B2 * | 5/2007 | Vogt | ............... | 365/52 |
| 7,221,614 B2 * | 5/2007 | Saito et al. | ............... | 365/51 |
| 7,319,635 B2 * | 1/2008 | Ahn et al. | ............... | 365/194 |
| 7,466,577 B2 * | 12/2008 | Sekiguchi et al. | ............... | 365/51 |
| 7,532,050 B2 * | 5/2009 | Haerle et al. | ............... | 327/158 |
| 7,542,322 B2 * | 6/2009 | McCall et al. | ............... | 365/52 |
| 7,644,216 B2 * | 1/2010 | Fahr et al. | ............... | 365/63 |
| 7,729,153 B2 * | 6/2010 | Dreps et al. | ............... | 365/51 |

FOREIGN PATENT DOCUMENTS

| | | |
|---|---|---|
| JP | 2003122624 A | 4/2003 |
| JP | 2006128339 A | 5/2006 |
| KR | 1020040048047 A | 6/2004 |

* cited by examiner

*Primary Examiner* — Trong Phan

(74) *Attorney, Agent, or Firm* — Volentine & Whitt, PLLC

(57) ABSTRACT

A multi-chip package memory includes an interface chip generating at least one reference signal defined in relation to a reference process variation, and a stacked plurality of memory chips electrically connected to the interface chip via a vertical connection path and receiving the reference clock signal via the vertical connection path, wherein each one of the stacked plurality of memory chips is characterized by a process variation and actively compensates for said process variation in relation to the reference signal.

6 Claims, 6 Drawing Sheets

US 8,054,663 B2

PROCESS VARIATION COMPENSATED MULTI-CHIP MEMORY PACKAGE

CROSS-REFERENCE TO RELATED PATENT APPLICATIONS

This application claims the benefit of Korean Patent Application No. 10-2008-0025377 filed on Mar. 19, 2008, the subject matter of which is hereby incorporated by reference.

BACKGROUND OF THE INVENTION

The present invention relates generally to multi-chip memory packages and methods of fabricating same. More particularly, the invention is related to multi-chip memory packages in which fabrication process variations are compensated.

As the size of mobile electronic devices decreases, the packaged semiconductor memories incorporated within these devices must be fabricated with ever more compact and lightweight designs. Reductions in size, weight and current consumption notwithstanding, semiconductor memories must operate at high speed with increased bandwidth. As a result, legacy electronic mobile devices included single-chip package memories. More recently, electronic mobile devices include multi-chip package memories formed by stack connecting a plurality of memory chips, wherein the plurality of memory chips may provide different types of memory system functionality.

In a conventional multi-chip package memory, constituent memory chips are stacked on an interface chip (e.g., a memory controller) using one or more of a number of available stacking techniques.

For example, within a conventional multi-chip package memory, first, second, and third memory chips may be physically stacked one on top of the other and the respective memory chips electrically connected to signal pads with bonding wires. That is, the first memory chip is electrically connected to a first pad with a first bonding wire, the second memory chip is electrically connected to a second pad with a second bonding wire, and the third memory chip is electrically connected to a third pad with a third bonding wire.

Alternately, a plurality of memory chips may be stack connected using vertical connection elements, such as through silicon vias (TSVs). The term TSV reads on a range of connection elements associated with a through hole via (THV). For example, where first, second, and third memory chips are stack connected, a TSV may be formed between the first memory chip and the second memory chip such that one or more signals may be communicated by the TSV formed the first memory chip to the second memory chip. In similar vein, another TSV may be formed between the second memory chip and the third memory chip, etc. In this manner, a collection of vertical connection elements may form a connection path through a stacked plurality of memory chips.

Unfortunately, stack connection approaches relying on vertical connection paths formed by multiple vertical connection elements are inherently susceptible to process variations in the manufacture of individual memory chips and related packaging processes. In particular, various process variations may result in different signal flight times between input/output (I/O) points within the stacked plurality of memory chips and/or different computational processing times for like elements between different memory chips and related circuits. For example, the first memory chip in a stacked plurality of memory chips may return read data in response to a read command applied to the multi-chip package memory with very different timing than the third chip in the same stack.

SUMMARY OF THE INVENTION

Embodiments of the invention provide a multi-chip package memory which compensates for process variations influencing the performance of stacked memory chips in order to prevent malfunctions and reduce power consumption.

In one embodiment, the invention provides a multi-chip package memory including; an interface chip generating clock signal and a reference delayed clock signal in relation to a defined reference process variation, and a stacked plurality of memory chips electrically connected to the interface chip via a vertical connection path and receiving the clock signal and the reference delayed clock signal via the vertical connection path, wherein each one of the stacked plurality of memory chips is characterized by a process variation and compensates for said process variation in relation to the reference delayed clock signal.

In certain related embodiments, each one of the stacked plurality of memory chips may include; a delay unit receiving the clock signal and the internal power voltage, and generating a corresponding delayed clock signal, a phase detection unit comparing a phase of the reference delayed clock signal with a phase of the delayed clock signal and generating a phase difference signal, and a power voltage control unit controlling the internal power voltage in response to phase difference signal.

In still further related embodiments, the power voltage control unit may include; a control unit generating a control signal in response to the phase difference signal, and a transistor giving a gate receiving the control signal, a first side connected to an external power voltage, and a second side connected to the delay unit.

In another embodiment, the invention provides a multi-chip package memory including; an interface chip providing a reference signal in relation to a defined reference process variation, and a stacked plurality of memory chips electrically connected to the interface chip via a vertical connection path and receiving the reference signal via the vertical connection path, wherein each one of the stacked plurality of memory chips is characterized by a process variation and compensates for said process variation in relation to the reference signal and comprises; a current source having a first side connected to an external power voltage source and providing a current, a resistance device connected to and interposed between ground voltage and the second side the current source, a comparison device comparing a voltage provided by the resistance device with the reference signal, and a control unit controlling the current source in response to an output signal provided by the comparison device.

DESCRIPTION OF EMBODIMENTS

Figure 1:
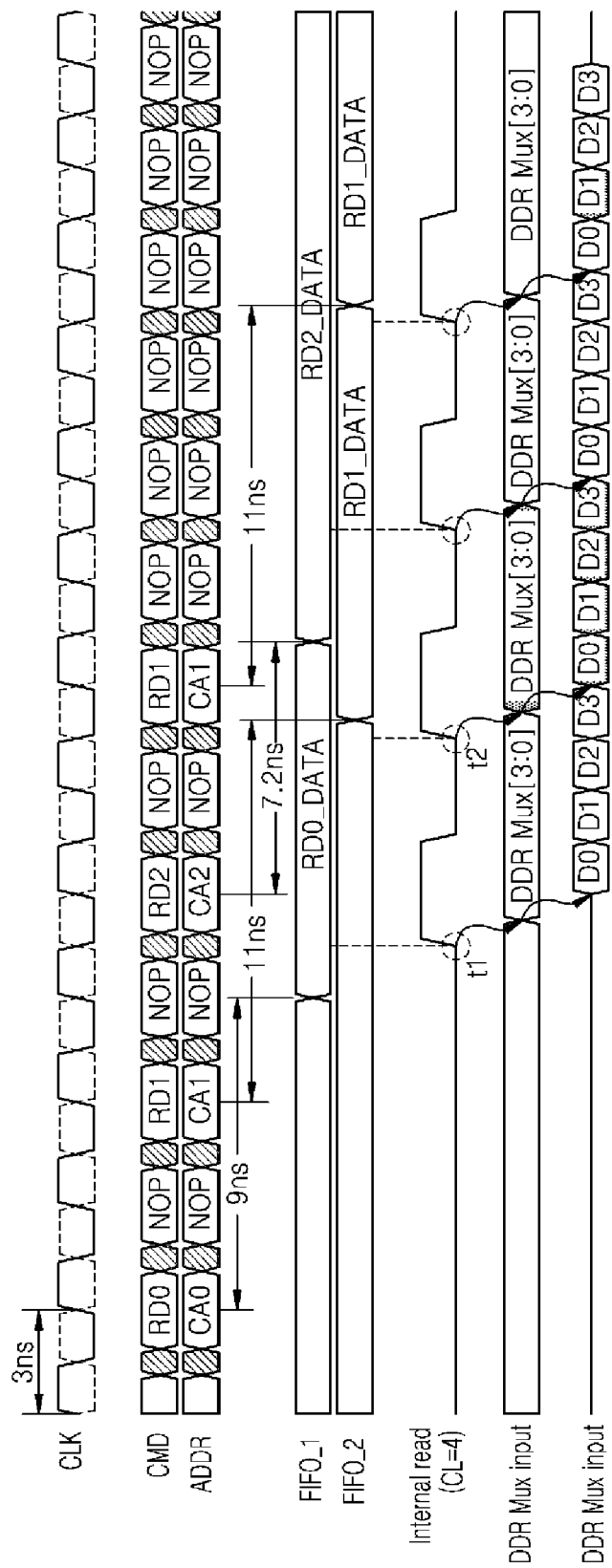
FIG. 1 is a signal and data waveform diagram characterizing a read operation executed according to a conventional operating technique.

The difficulties noted above in relation to conventional multi-chip package memories and related process variations are further illustrated by way of background information in relation to FIG. 1. FIG. 1 is a signal and data waveform diagram characterizing a read operation executed in accordance with a technique associated with a conventional multi-chip package memory that receives an externally provided clock CLK.

Within FIG. 1, a first read command RD0 is applied to a first memory chip within a stacked plurality of memory chips as a CMD command signal, a second read command RD1 is applied to a second memory chip, and a third read command RD2 is applied to a third memory chip. No operation performed NOP commands are also shown in between the read (RD) commands. Taking into account all relevant process variations, the first memory chip outputs read data in 9 ns. That is, a first time interval between receipt (input) of the first read command RD0 and provision (output) of the corresponding first read data RD0_DATA by an associated first FIFO (First-In-First-Out Buffer) FIFO_1 is 9 ns. In similar manner, process variation associated with the second memory chip results in a second time interval of 11 ns, and process variation associated with the third memory chip results in a third time interval of 7.2 ns.

When the first read data RD0_DATA stored in FIFO_1 is read at time of t1 of the Internal read (CL =4) signal as shown, no problems occur. However, when the second read data RD1_DATA stored in FIFO_2 is read at time t2 in response to the second read command RD1, data D1_DATA is not properly read due to the different process variations between memory chips. That is, the second memory chip provides the second read data RD1_DATA too slowly in relation to the first memory chip. Third read data RD2 DATA is also shown. Also shown in FIG. 1 is the DDR Mux input signal denoted as DDR Mux [3:0] for each of the read data, and further shown as D0, D1, D2 and D3.

As a result of this possibility, additional data buffers (e.g., FIFOS) must be provided in the multi-chip package memory, as compared with a single-chip package memory, in order to ensure data coherency. In contrast, embodiments of the invention enjoy material operational advantages.

It should be noted that the several embodiments of the invention described hereafter are merely selected examples teaching the making and use of the invention. The invention may, however, be variously embodied and should not be construed as being limited to only the illustrated embodiments. The embodiments will be described with reference to the accompanying drawings. In the written description and drawings, like reference numerals are used to indicate like or similar elements, and repetitive explanation or description is omitted for the sake of brevity.

A multi-chip package memory according to an embodiment of the invention comprises a transfer memory chip (e.g., an interface chip or memory controller chip), and first to nth memory chips, where n is a natural number, stacked connected via at least one vertical connection element, such as a TSV. The transfer memory chip communicates externally provided signals (e.g., various address, data, and control signals) to the first through nth memory chips, and/or communicates data retrieved from the first through nth memory chips to circuits disposed external to the multi-chip package memory. In certain embodiments, each one of the first through nth memory chips includes at least one memory bank designated within the plurality of memory cells storing data. First through nth memory chips are stack connected on top of the transfer memory chip. In this context, the term "stack connected" means a plurality of memory chips is physically stacked in a vertical direction relative to a principal horizontal plane of the transfer memory chip and electrically connected using at least one vertical connection path. Those skilled in the art will recognize that the terms vertical and horizontal are merely used to indicate relative position of elements in relation to the illustrated embodiments. One or more vertical connection paths may be formed to extend vertically through the stacked plurality of memory chips. Said vertical connection paths may extend all the way from the top surface of the transfer memory chip to a top surface of the (uppermost) nth memory chip, or may be terminated within the stacked plurality of memory chips.

Figure 2:
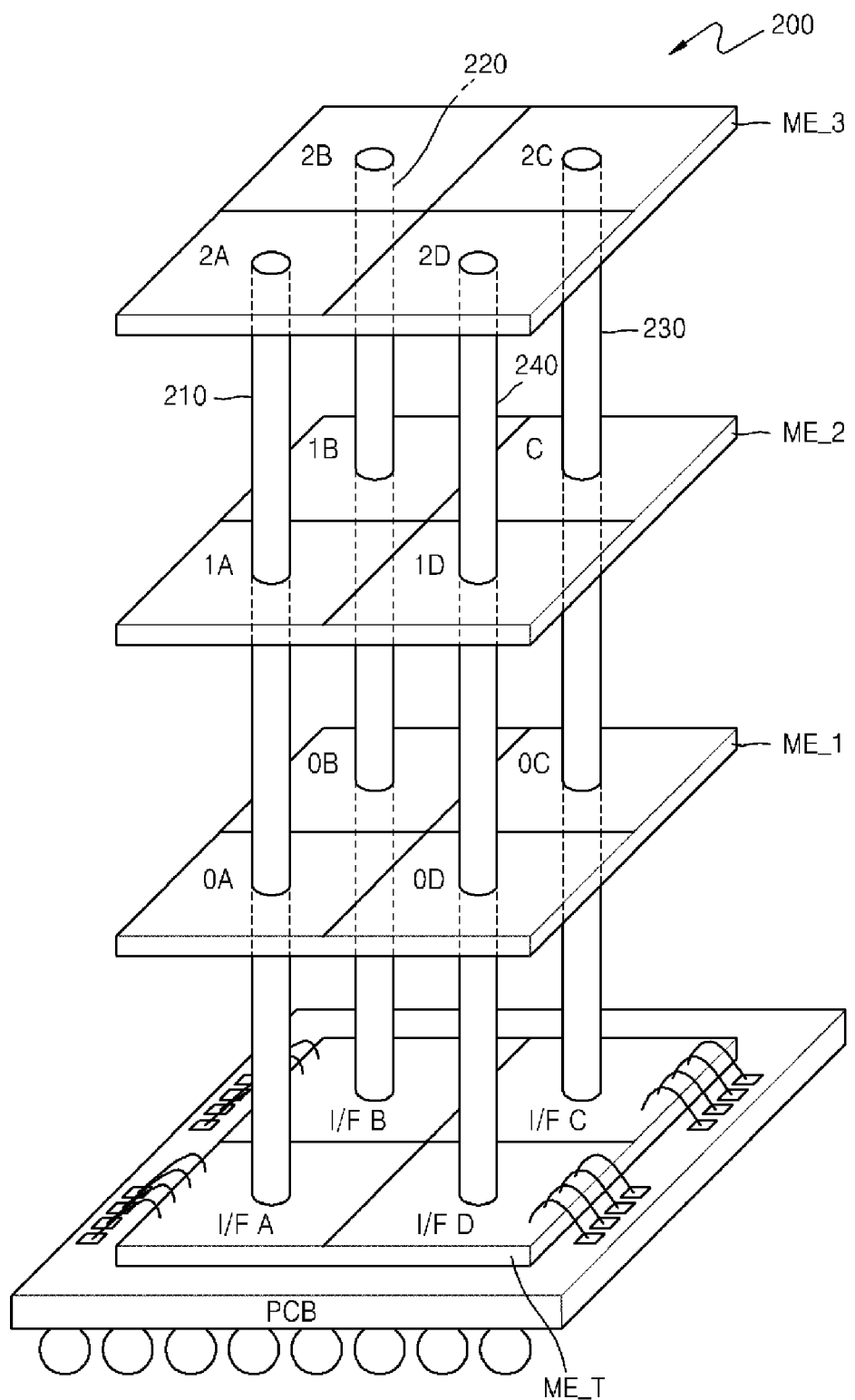
FIG. 2 is a perspective view of a multi-chip package memory according to an embodiment of the invention.

FIG. 2 is a perspective view of a multi-chip package memory 200 including first, second, and third memory chips ME_1, ME_2, and ME_3 stacked on a transfer memory chip ME_T disposed on a printed circuit board (PCB) according to an embodiment of the invention. Those skilled in the art will, however, recognize that the choice of three (3) stacked memory chips is merely one example of any reasonable number ("n") of memory chips that may be stacked on an interface chip like transfer memory chip ME_T.

Referring to FIG. 2, the multi-chip package memory 200 includes the transfer memory chip ME_T, the first, second, and third memory chips ME_1, ME_2, and ME_3, and four (4) vertical connection paths (e.g., TSVs) 210, 220, 230, and240. The transfer memory chip ME_T is disposed on the PCB and is configured to communicate externally provided Input signals (e.g., one or more of command CMD signals or clock CLK signals, address ADDR signals designating a chip address CA (e.g., one or more chip addresses CA0, CA1, CA2, etc.), and/or data signals or "C/A/D signals") to at least one of the first, second, and third memory chips ME_1, ME_2, and ME_3. The transfer memory chip ME_T also communicates Output signals (e.g., read data) provided by one or more of the first memory chip ME_1, the second memory chip ME_2, and/or the third memory chip ME_3 to circuits disposed external to the multi-chip package memory 200. In various embodiments of the invention, the transfer memory chip ME_T may take the form of a interface chip, a memory controller, a central processing unit (CPU), etc.

In the illustrated example of FIG. 2, each one of the first, second, and third memory chips ME_1, ME_2, and ME_3 comprises an array of memory cells divided into four banks 0A, 0B, 0C, and 0D; 1A, 1B, 1C, and 1D; and 2A, 2B, 2C, and 2D, respectively. Such division between designated portions of a memory cell array for purposes of organizing access to stored data is a matter of design choice understood by one of ordinary skill in the art. In the illustrated example of FIG. 2, each of the first, second, and third memory chips ME_1, ME_2, and ME_3 within multi-chip package memory 200 are connected to transfer memory chip ME_T via first through fourth vertical connection paths 210, 220, 230, and 240 on a bank-by-bank basis. That is, first vertical connection path 210 communicates Input/Output (I/O) signals to/from transfer memory chip ME_T to one or more of the first memory banks 0A, 1A, and 2A, second vertical connection path 220 communicates I/O signals to/from transfer memory chip ME_T to one or more of the second memory banks 0B, 1B, and 2B, third vertical connection path 230 communicates I/O signals to/from transfer memory chip ME_T to one or more of the third memory banks 0C, 1C, and 2C, and fourth vertical connection path 230 communicates I/O signals to/from transfer memory chip ME_T to one or more of the fourth memory banks 0D, 1D, and 2D.

In this regard, it should be noted that the I/O circuitry associated each one of the first through fourth vertical connection paths 210-230 within transfer memory chip ME_T may be disposed in a bank like arrangement, as illustrated in FIG. 2. In this manner, vertically running connection paths may be terminated in transfer memory chip ME_T at respective portions I/F A, I/F B, I/F C and I/F D of transfer memory chip ME_T with minimal lateral running interconnections to improve signal transfer characteristics and speed.

Using one or more of these vertical connection paths, the transfer memory chip ME_T provides a process variation "compensation signal" related to the process variation of each memory chip. As described above and in the context of the exemplary embodiments, the term "process variation" refers to a particular time interval between receipt of command (e.g., a read command) by the transfer memory chip ME_T and completed execution of the command (i.e., the output of read data identified by the received read command, or the stable provision of the read data in a designated buffer or latch circuit).

Thus, operations performed by the first memory chip ME_1 in response to C/A/D signals generated by the transfer memory chip ME_T in response to a received command, may compensate for the unique process variation that characterizes the first memory chip ME_1. In effect, operation of the first memory chip ME_1 is controlled in relation to its process variation, as a unique I/O characteristic, in order to "standardize" the post-compensation process variation of the first memory chip ME_1 such that it operates within a defined standard (i.e., its unique process variation falls within a defined range of a "reference process variation"). When a first process variation for the first memory chip ME_1 is properly compensated, the first memory chip ME_1 executes one or more operations in response to a received command using an internally generated ("internal") power voltage that corresponds to the post-compensated process variation.

For example, when a read command is received in relation to data stored in the first memory chip ME_1, a corresponding read operation is executed by the first memory chip ME_1 using a first internal power voltage that is determined in relation to the compensated process variation. The second memory chip ME_2 and third memory chip ME_3 operate similarly to generate a second and third internal power voltages.

Hereinafter, an exemplary method of compensating a process variation for each respective memory chip in a stacked plurality of memory chips within a multi-chip package memory will be described in some additional detail.

Figure 3:
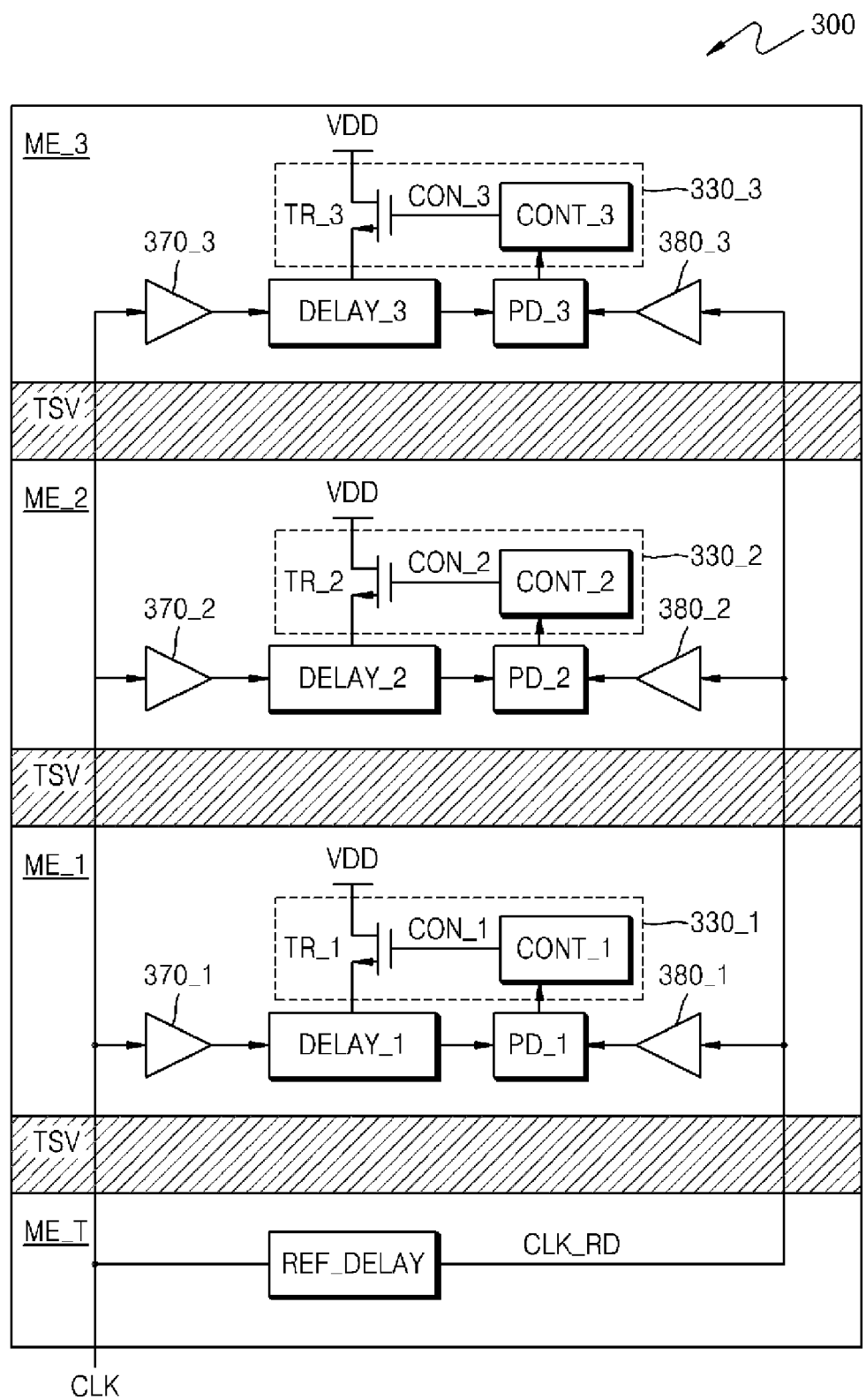
FIG. 3 is a conceptual cross-sectional view of a multi-chip package memory according to an embodiment of the invention.

FIG. 3 is a cross-sectional view of a multi-chip package memory 300 according to an embodiment of the invention.

Referring to FIG. 3, the multi-chip package memory 300 generally comprises a transfer memory chip ME_T and stacked first, second and third memory chips ME_1, ME_2, and ME_3 (e.g., n=3 in this particular example). The various vertical connection paths connecting the stacked plurality of memory chips is conceptually illustrated in FIG. 3 as corresponding TSV layers.

The transfer memory chip ME_T receives an externally provided clock signal CLK, or in the alternative generates the clock signal CLK from an externally provided reference signal. The transfer memory chip ME_T then delays the clock signal CLK to generate a reference delayed clock signal CLK_RD which is used by the stacked plurality of memory chips as a reference signal. As shown in FIG. 3, the first memory chip ME_1 receives both the clock signal CLK and the reference delayed clock signal CLK_RD, and then controls the amount of a delay applied to the received clock signal CLK in relation to the reference delayed clock signal CLK_RD in order to control the first process variation associated with the first memory chip ME_1. The second memory chip ME_2 and third memory chip ME_3 operate similarly in relation to respective second and third process variations.

Within this configuration, the transfer memory chip ME_T comprises a reference delay unit REF_DELAY imparting a defined delay to received clock signal CLK in order to generate the reference delayed clock signal CLK_RD. The reference delay unit REF_DELAY may be variously implemented, as is understood by those skilled in the art, using, for example, a plurality of series connected inverters forming an inverter chain. The amount of delay imparted by the reference delay unit REF_DELAY will vary in accordance with the operating frequency of the multi-chip package memory 300. That is, the reference delay unit REF_DELAY will impart a greater delay to the received clock signal CLK when the operating frequency of the multi-chip package memory 300 is relatively low. When the operating frequency of the multi-chip package memory 300 is relatively low, the amount of delay provided by the reference delay unit REF_DELAY may be increased in order to reduce the overall power consumption of the multi-chip package memory 300. On the other hand, when the operating frequency of the multi-chip package memory 300 is relatively high, the amount of delay provided by the reference delay unit REF_DELAY will typically be decreased.

In the embodiment illustrated in FIG. 3, the first memory chip ME_1 comprises a (first) delay unit DELAY_1, a (first) phase detection unit PD_1, and a (first) power voltage control unit 330_1. The delay unit DELAY_1 delays the received clock signal CLK and generates a delayed clock signal CLK. The delay unit DELAY_1 may be implemented in on embodiment using an inverter chain. The phase detection unit PD_1 compares the phase of the delayed clock signal provided by the delay unit DELAY_1 with the phase of the reference delayed clock signal CLK_RD. The power voltage control unit 330_1 controls a (first) power voltage applied to the delay unit DELAY_1 in response to a phase difference signal provided by the phase detection unit PD_1. That is, assuming that the delay unit DELAY_1 is an inverter chain, the power voltage control unit 330_1 controls the waveform of the delayed clock signal CLK by adjusting the first power voltage applied to each one of the series connected inverters forming the inverter chain.

In the illustrated example of FIG. 3, the power voltage control unit 330_1 comprises a (first) control unit CONT_1 providing a (first) control signal CON_1 in response to the phase difference signal provided by the phase detection unit PD_1. The control signal CON_1 is applied to the gate of transistor TR_1 having a first side thereof connected to an external power voltage VDD and a second side connected to the delay unit DELAY_1. That is, the power voltage control unit 330_1 controls a voltage level of a power voltage applied to the delay unit DELAY_1 in response to the control signal CON_1 provided by the control unit CONT_1.

The first memory chip ME_1 further comprises a first buffer 370_1 receiving the clock signal CLK and providing a buffered clock signal to the delay unit DELAY_1, and a second buffer 380_1 receiving the reference delayed clock signal CLK_RD and providing a buffered reference delayed clock signal to the phase detection unit PD_1. The incidental (or defined) delays respectively imparted by the first buffer 370_1 and second buffer 380_1 may be matched. Memory chips ME_2 and ME_3 respectively include buffers 370_2 and 370_3.

As a result of the operation described above, the total first delay applied to the clock signal CLK by the first memory chip ME_1 may be similar to a total reference delay applied to the clock signal CLK by the transfer memory chip ME_T. In this manner, the first memory chip ME_1 compensates for its unique (first) process variation, such that the post-compensation process variation exhibited by the first memory chip ME_1 is similar to the reference process variation defined in relation to the transfer memory chip ME_T. Numerical values (or compensation values) indicative of the first process variation, the corresponding first post-compensation process variation, and reference process variation may be stored in a register (not shown) associated with multi-chip package memory 300. When an external command is received by multi-chip package memory 300, it may be executed with reference to one or more of these stored compensation values, such that various internal power voltage(s) are properly controlled in view of the process variation(s) associated with one or more chips in the multi-chip package memory 300.

As may be ascertained from FIG. 3, the second memory chip ME_2 and the third memory chip ME_3 may be similar configured and operated with delay units DELAY_2 and DELAY_3, phase detection units PD_2 and PD_3, and power voltage control units 330_2 and 330_3, etc. Memory chip ME_2 includes control unit CONT_2 that provides control signal CON_2 to transistor TR_2, and memory chip ME_3 includes control unit CONT_3 that provides control signal CON_3 to transistor TR_3, whereby the memory chips ME_2 and ME_3 are configured similarly as memory chip ME_1.

Figure 4:
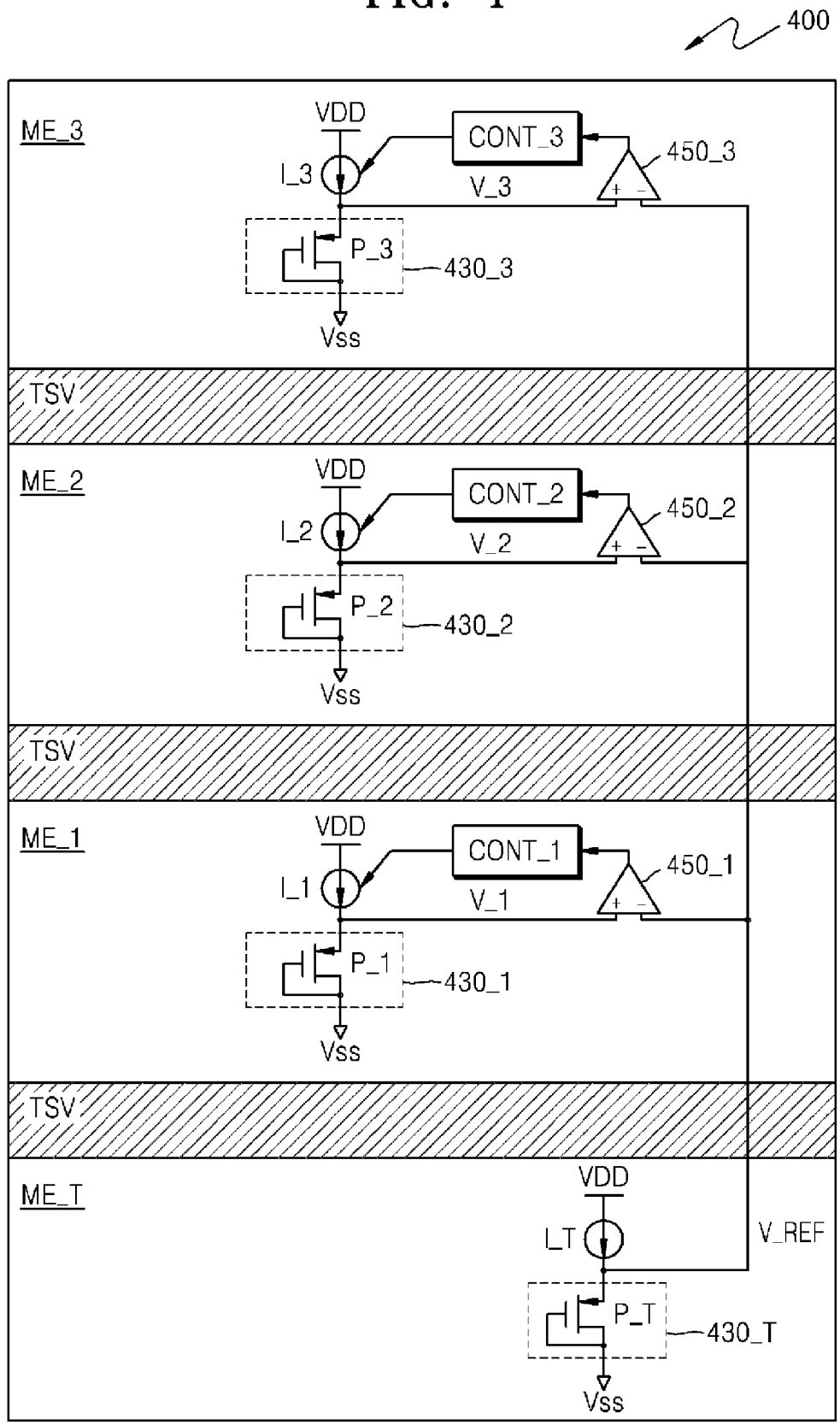
FIG. 4 is another conceptual cross-sectional view of a multi-chip package memory according to an embodiment of the invention.

FIG. 4 is a cross-sectional view of a multi-chip package memory 400 according to another embodiment of the invention.

Referring to FIG. 4, the multi-chip package memory 400 again comprises a transfer memory chip ME_T and first, second and third memory chips ME_1, ME_2, and ME_3, as a working example.

The transfer memory chip ME_T comprises a reference current source I_T and a reference resistance device 430_T. The reference current source I_T is connected to an external power voltage VDD and provides a current to the reference resistance device 430_T that is connected to and interposed between a ground voltage VSS and the reference current source I_T. The reference resistance device 430_T may be implemented in one embodiment using a PMOS transistor P_T, where the ground voltage VSS is applied to its gate and first side, and the reference current source I_T is applied to its second side. The PMOS transistor P_T exhibits a resistance having a magnitude that varies inversely (1/gm) with a transfer conductance component. Accordingly, a resulting reference signal V_REF has a level determined by the reference resistance device 430_T (i.e., the level of the voltage generated when current flows through the PMOS transistor P_T).

The amount of current supplied by the reference current source I_T will vary with the operating frequency of the multi-chip package memory 400. That is, the amount of current supplied by the reference current source I_T is lower when the operating frequency of the multi-chip package memory 400 is relatively low. When the operating frequency of the multi-chip package memory 400 is relatively low, the reference current source I_T provides a relatively low level of current in order to reduce power consumption of the low multi-chip package memory 400. On the other hand, when the operating frequency of the multi-chip package memory 400 is relatively high, the reference current source I_T provides a higher amount of current, and thus, the voltage level of the reference signal V_REF is increased.

Within the embodiment illustrate in FIG. 4, the first memory chip ME_1 comprises a (first) current source I_1, a (first) resistance device 430_1, a (first) comparison device 450_1, and a (first) control unit CONT_1. The current source I_1 is connected to an external power voltage VDD and provides a current to the resistance device 430_1 that is connected to and interposed between ground voltage VSS and the current source I_1. The resistance device 430_1 may be a PMOS transistor P_1 including a gate, a first side, and a second side, wherein ground voltage VSS is applied to the gate and the first end, and the second end is connected to the current source I_1. As described above, the PMOS transistor P_1 exhibits a resistance having a magnitude corresponding to the inverse (1/gm) of a transfer conductance component. Therefore, a (first) voltage level V_1 provided by the resistance device 430_1 will vary according to the characteristics of the PMOS transistor P_1. That is, the resistance device 430_1 may exhibit various voltage levels according to the transfer conductance component (gm) associated with the PMOS transistor P_1. The comparison device 450_1 compares the first voltage level V_1 provided by the resistance device 430_1 with the reference signal V_REF, and the control unit CONT_1 controls the current source I_1 in response to an output signal of the comparison device 450_1.

As a result of the operation described above, the level of current flowing through the PMOS transistor P_1 of the first memory chip ME_1 is similar to the level of current flowing through the PMOS transistor P_T of the transfer memory chip ME_T. Accordingly, the first memory chip ME_1 is able to compensate for a first process variation such that the first process variation of the first memory chip ME_1 is similar to a defined reference process variation. Here again, various compensation values may be stored in a register (not shown) associated with multi-chip package memory 400. When an external command is received by multi-chip package memory 400, the command may be executed in relation to an internal power voltage that is controlled by the stored compensation value.

The second memory chip ME_2 and the third memory chip ME_3 are respectively operated in a similar manner within multi-chip package memory 400, and current sources I_2 and I_3, resistance devices 430_2 and 430_3 which respectively include PMOS transistors P_2 and P_3 which provide voltage levels V_2 and V_3, comparison devices 450_2 and 450_3, and control units CONT_2 and CONT_3 of the second and third memory chips ME_2 and ME_3 may be similarly embodied and operated.

Figure 5:
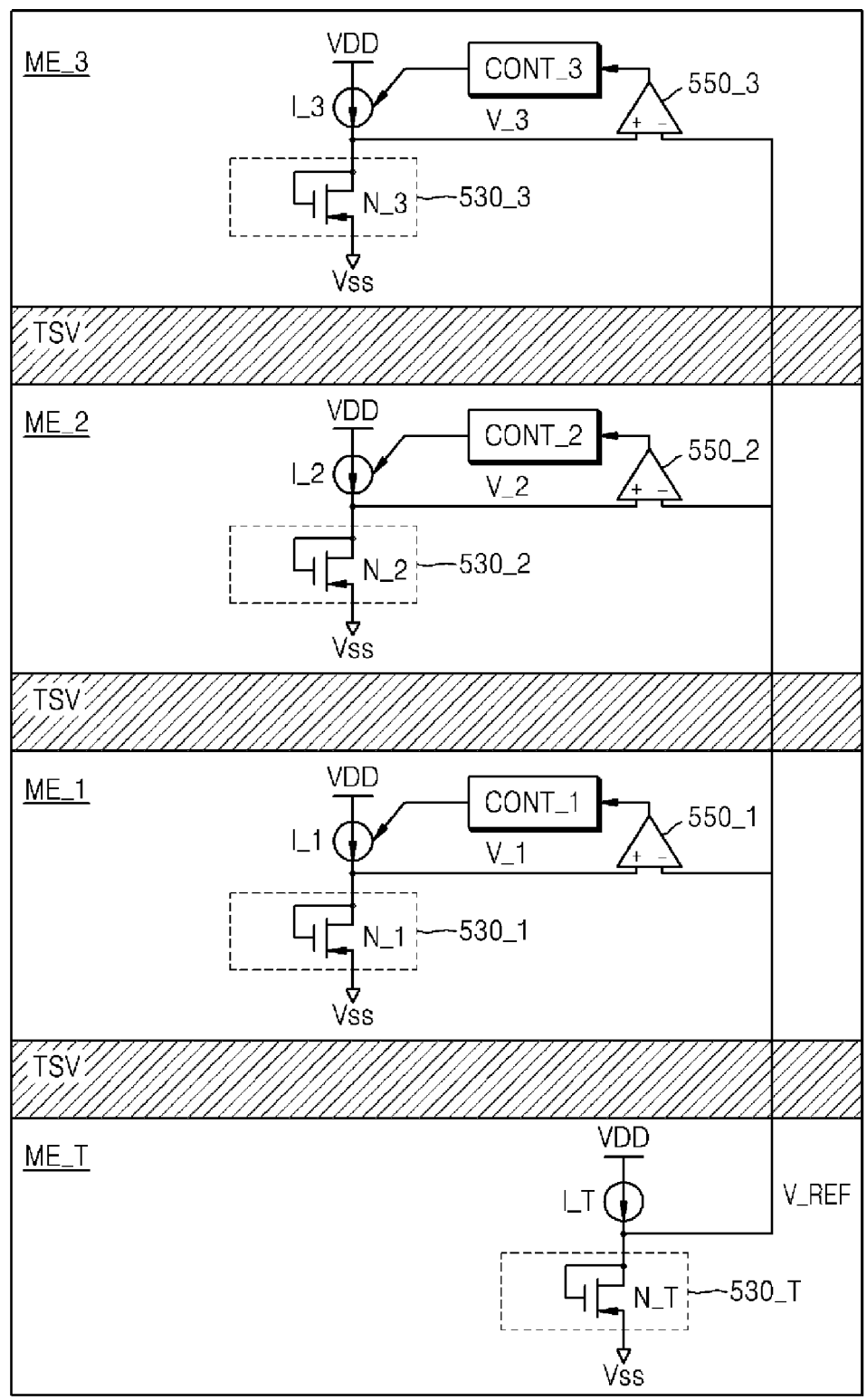
FIG. 5 is a yet another conceptual cross-sectional view of a multi-chip package memory according to an embodiment of the invention.

FIG. 5 is a cross-sectional view of a multi-chip package memory 500 according to another embodiment of the invention.

Referring to FIGS. 4 and 5, the multi-chip package memory 500 of FIG. 5 is the same as the multi-chip package memory 400 of FIG. 4, except for a reference resistance device 530_T and resistance devices 530_1, 530_2, and 530_3. Accordingly, only the reference resistance device 530_T and the resistance device 530_1, 530_2, and 530_3 will now be described in detail. That is, control units CONT_1, CONT_2 and CONT_3, comparison devices 50_1, 550_2 and 550_3, and voltage levels V_1, V_2 and V_3 are disposed in a somewhat similar manner as the corresponding features in FIG. 4, and further explanation is omitted for the sake of brevity.

As illustrated in FIG. 5, the reference resistance device 530_T and the resistance devices 530_1, 530_2, and 530_3 may be NMOS transistors. That is, the reference resistance device 530_T may be an NMOS transistor N_T including a gate, a first side, and a second side, wherein the gate and the first side are connected to a current source I_T and ground voltage VSS is applied to the second side. The resistance devices 530_1, 530_2, and 530_3 may be NMOS transistors N_1, N_2, and N_3, respectively. In the NMOS transistor N_1, a gate and a first side are connected to a current source I_1 and ground voltage VSS is applied to a second side. In the NMOS transistor N_2, a gate and a first side are connected to a current source I_2 and ground voltage VSS is applied to a second side. In the NMOS transistor N_3, a gate and a first side are connected to a current source I_3 and ground voltage VSS is applied to a second side.

Figure 6:
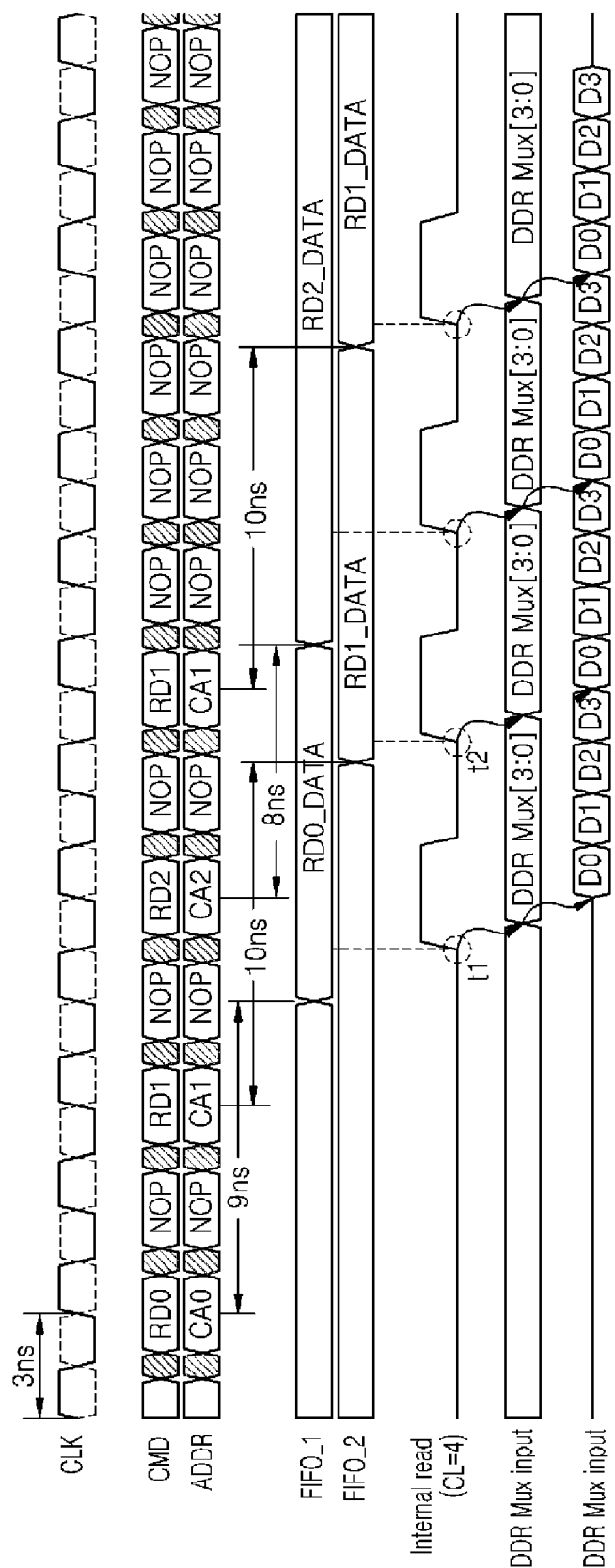
FIG. 6 is a signal and data waveform diagram characterizing a read operation executed after process variation compensation within an embodiment of the invention.

FIG. 6 is a signal and data waveform diagram illustrating execution of a read operation within an embodiment of the invention having respective process variations compensated as described above.

As described with reference to FIG. 1, a first read command RD0 is a read command applied to a first memory chip within a stacked plurality of memory chips, a second read command RD1 is a read command applied to a second memory chip within the stacked plurality of memory chips, and a third read command RD2 is a read command applied to a third memory chip within the stacked plurality of memory chips.

Referring to FIGS. 1 and 6, as in the conventional technique described with reference to FIG. 1, a first process variation for the first memory chip is assumed to be 9 ns. Further, a reference process variation is established to be 9 ns. However, the second and third process variations for the second and third memory chips are different from those apparent in the conventional technique previously described. In the conventional technique described with reference to FIG. 1, the second process variation for the second memory chip was 11 ns. However, after the compensation process provided by an embodiment of the present invention is applied, the second process variation is adjusted to 10 ns. That is, with reference to FIG. 6, the shortest process variation is 8 ns and the longest process variation is now 10 ns.

According to the conventional technique described with reference to FIG. 1, when the data RD1_DATA stored in the second FIFO is read at time t2 in response to the second read command RD1, the data RD1_DATA is abnormally read. However, with its process variation compensated according to an embodiment of the invention, the second memory chip properly provides data RD1_DATA to the second FIFO, and the resulting read data may be normally read at time t2 in response to the second read command RD1.

Although the process variation of each of the memory chips is not identical to the reference process variation of 9 ns, it can be seen that possibility of malfunctioning of a multi-chip package memory is substantially reduced as compared to a multi-chip package memory employing the conventional technique. Also, as a process variation of each of the memory chips is more similar to the reference process variation, the possibility of malfunctioning of a multi-chip package memory is reduced.

Each of the memory chips may be periodically compensated in relation to its process variation during, for example, an initialization process or during a prescribed period of operation. For example, assuming the memory chips are DRAMs, respective memory chips perform a refresh operation. In this regard, the process variation associated with one or more stacked memory chips may change as the result of a refresh operation. Thus, the process variation may be periodically compensated for during operation of the memory chips in addition to an initialization operation. Therefore, as the operating temperature of the memory chips changes, the resulting process variation may be periodically and dynamically compensated.

A multi-chip package memory according to the present invention compensates process variations for a stacked plurality of memory chips. Therefore, unlike conventional multi-chip package memories, the multi-chip package memory according to the present invention prevents malfunctions without the additional requirement of data buffers (e.g., FIFOs) and commensurate signal delays. This results in lower overall manufacturing costs, excellent operating characteristics, and reduced power consumption because each of the stacked memory chips requires only essential operating power.

Although the embodiments are described with specific terms and in relation to specific circuits, those skilled in the art will understand that other embodiments of the invention are possible without departing from the scope of the present invention as defined by the following claims.

What is claimed is:

1. A multi-chip package memory comprising:
an interface chip generating a clock signal and a reference delayed clock signal in relation to a defined reference process variation; and
a stacked plurality of memory chips electrically connected to the interface chip via a vertical connection path, and receiving the clock signal and the reference delayed clock signal generated by the interface chip via the vertical connection path,
wherein each one of the stacked plurality of memory chips is characterized by a process variation and compensates for said process variation responsive to the reference delayed clock signal,
wherein the interface chip is a transfer memory chip having a process variation equal to the reference process variation, and
wherein the transfer memory chip comprises a reference delay unit that delays the clock signal and provides an output as the reference delayed clock signal sent to the stacked plurality of memory chips.

2. The multi-chip package memory of claim 1, wherein each one of the stacked plurality of memory chips generates an internal power voltage in relation to the clock signal and the reference delayed clock signal.

3. The multi-chip package memory of claim 2, wherein each one of the stacked plurality of memory chips comprises:
a delay unit receiving the clock signal and the internal power voltage, and generating a corresponding delayed clock signal;
a phase detection unit comparing a phase of the reference delayed clock signal with a phase of the delayed clock signal, and generating a phase difference signal; and
a power voltage control unit controlling the internal power voltage in response to phase difference signal.

4. The multi-chip package memory of claim 3, wherein the power voltage control unit comprises:
a control unit generating a control signal in response to the phase difference signal; and
a transistor including a gate receiving the control signal, a first side connected to an external power voltage, and a second side connected to the delay unit.

5. The multi-chip package memory of claim 3, wherein each one of the stacked plurality of memory chips further comprises:

a first buffer receiving the clock signal and providing a buffered clock signal to the delay unit as the clock signal; and a second buffer receiving the reference delayed clock signal and providing a buffered reference delayed clock signal to the phase detection unit as the reference delayed clock signal, wherein the first buffer and the second buffer have similar delay characteristics.

6. The multi-chip package memory of claim 1, wherein the reference delay unit imparts a greater delay to the clock signal as the operating frequency of the multi-chip package memory is lowered.

* * * * *